United States Patent
Choi et al.

(10) Patent No.: US 10,104,788 B2
(45) Date of Patent: Oct. 16, 2018

(54) DISPLAY DEVICE

(71) Applicant: SAMSUNG DISPLAY CO., LTD., Yongin-si, Gyeonggi-do (KR)

(72) Inventors: Jinhwan Choi, Yongin-si (KR); Taewoong Kim, Yongin-si (KR); Boik Park, Yongin-si (KR); Taean Seo, Yongin-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/420,454

(22) Filed: Jan. 31, 2017

(65) Prior Publication Data

US 2017/0295654 A1 Oct. 12, 2017

(30) Foreign Application Priority Data

Apr. 12, 2016 (KR) .......................... 10-2016-0044940

(51) Int. Cl.
| | |
|---|---|
| *H05K 5/00* | (2006.01) |
| *H05K 5/02* | (2006.01) |
| *H01L 51/52* | (2006.01) |
| *H01L 27/32* | (2006.01) |
| *G02B 5/30* | (2006.01) |

(52) U.S. Cl.
CPC ....... *H05K 5/0017* (2013.01); *H01L 51/5237* (2013.01); *H01L 51/5281* (2013.01); *H05K 5/0226* (2013.01); *G02B 5/30* (2013.01); *H01L 27/323* (2013.01); *H01L 27/3244* (2013.01); *H01L 2251/5338* (2013.01)

(58) Field of Classification Search
CPC .. H05K 5/0017; H05K 5/0226; H01L 27/323; H01L 51/5237; H01L 51/5281
USPC .......................................................... 361/749
See application file for complete search history.

(56) References Cited

U.S. PATENT DOCUMENTS

| | | | |
|---|---|---|---|
| 9,164,547 B1 * | 10/2015 | Kwon | G06F 1/1656 |
| 2006/0143958 A1 * | 7/2006 | Gerrits | G09F 21/04 |
| | | | 40/591 |
| 2010/0201604 A1 | 8/2010 | Kee et al. | |
| 2010/0277665 A1 * | 11/2010 | Kuo | G02F 1/13336 |
| | | | 349/58 |
| 2012/0264489 A1 * | 10/2012 | Choi | H04M 1/0216 |
| | | | 455/566 |
| 2014/0145587 A1 * | 5/2014 | Yoon | H01L 21/6835 |
| | | | 313/512 |
| 2014/0347806 A1 * | 11/2014 | Totani | G06F 1/1647 |
| | | | 361/679.27 |
| 2015/0255023 A1 * | 9/2015 | Lee | G09G 3/36 |
| | | | 345/204 |

(Continued)

FOREIGN PATENT DOCUMENTS

| | | |
|---|---|---|
| JP | 2005-141715 A | 6/2005 |
| KR | 10-2007-0077654 A | 7/2007 |

(Continued)

*Primary Examiner* — Timothy Thompson
*Assistant Examiner* — Charles Pizzuto
(74) *Attorney, Agent, or Firm* — Lee & Morse, P.C.

(57) ABSTRACT

A display device includes a first housing, a second housing rotatably connected to the first housing, and a first display panel disposed over the first housing and the second housing. An edge of the first display panel may be bent along at least a portion of at least one of an edge of the first housing and an edge of the second housing.

14 Claims, 7 Drawing Sheets

(56) References Cited

U.S. PATENT DOCUMENTS

2016/0092013 A1* 3/2016 Tung ................... G06F 3/0412
                                                      349/12
2017/0285819 A1* 10/2017 Li ....................... G06F 3/0412

FOREIGN PATENT DOCUMENTS

| KR | 10-2008-0035709 A | 4/2008 |
|----|-------------------|--------|
| KR | 10-2010-0092222 A | 8/2010 |
| KR | 10-1329946 B1 | 11/2013 |

* cited by examiner

DISPLAY DEVICE

CROSS-REFERENCE TO RELATED APPLICATION

Korean Patent Application No. 10-2016-0044940, filed on Apr. 12, 2016, in the Korean Intellectual Property Office, and entitled: "Display Device," is incorporated by reference herein in its entirety.

BACKGROUND

1. Field

Embodiments relate to a display device.

2. Description of the Related Art

Electronic devices based on mobility have come into widespread use. Recently, tablet personal computers (PCs), in addition to small-sized electronic devices such as a mobile phone, have been widely used as the mobile electronic devices.

In order to support various functions, the mobile electronic devices include a display device for providing a user with visual information such as images or videos. In this regard, the display device may include a display panel.

SUMMARY

Embodiments are directed to a display device, including a first housing, a second housing rotatably connected to the first housing, and a first display panel disposed over the first housing and the second housing. An edge of the first display panel may be bent along at least a portion of at least one of an edge of the first housing and an edge of the second housing.

The first display panel may be folded when the first housing and the second housing are folded together.

The first display panel may include a first display portion disposed over the first housing and the second housing, and a first non-display portion surrounding an edge of the first display portion, the first non-display portion being an opaque area.

The first non-display portion may be installed in the second housing, and at least a portion of the first non-display portion may be bent along at least a portion of the edge of the second housing.

The edge of the second housing may be rounded.

The first display panel may be flexible.

At least one of a first polarization layer and a first touch panel may be disposed over the first display panel.

The display device may further include a first protection layer disposed over a lower surface of the first display panel.

The display device may further include a third housing rotatably connected to the second housing.

The third housing may be folded between the first housing and the second housing.

The display device may further include a second display panel separate from the first display panel and installed over the third housing.

The second display panel may be installed over the third housing, and a portion of the second display panel may be bent along at least a portion of an edge of the third housing.

The second display panel may include a second display portion disposed over the third housing, and a second non-display portion surrounding an edge of the second display portion, the second non-display portion being an opaque area.

The second non-display portion may be installed in the third housing, and the second non-display portion may be bent along at least a portion of the edge of the third housing.

Embodiments are also directed to a display device, including a first housing, a second housing movably connected to the first housing, and a first display panel installed over the first housing and the second housing. An edge of the first display panel may provide a tensile force.

The edge of the first display panel providing the tensile force may be a non-display area.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
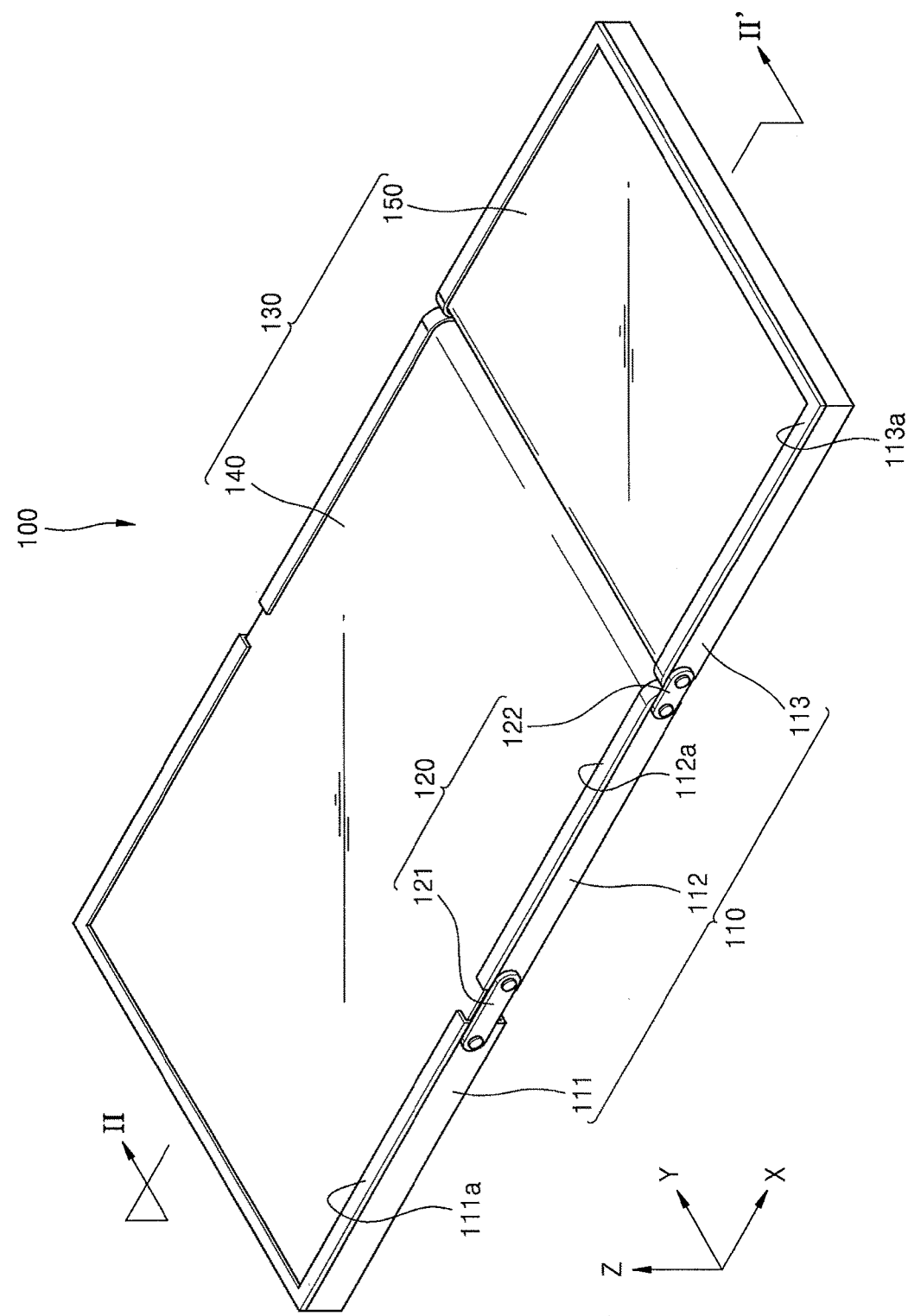
FIG. 1 illustrates a perspective view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout.

As used herein, the term "and/or" includes any and all combinations of one or more of the associated listed items. Expressions such as "at least one of" when preceding a list of elements, modify the entire list of elements and do not modify the individual elements of the list.

It will be understood that although the terms "the first", "the second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2:
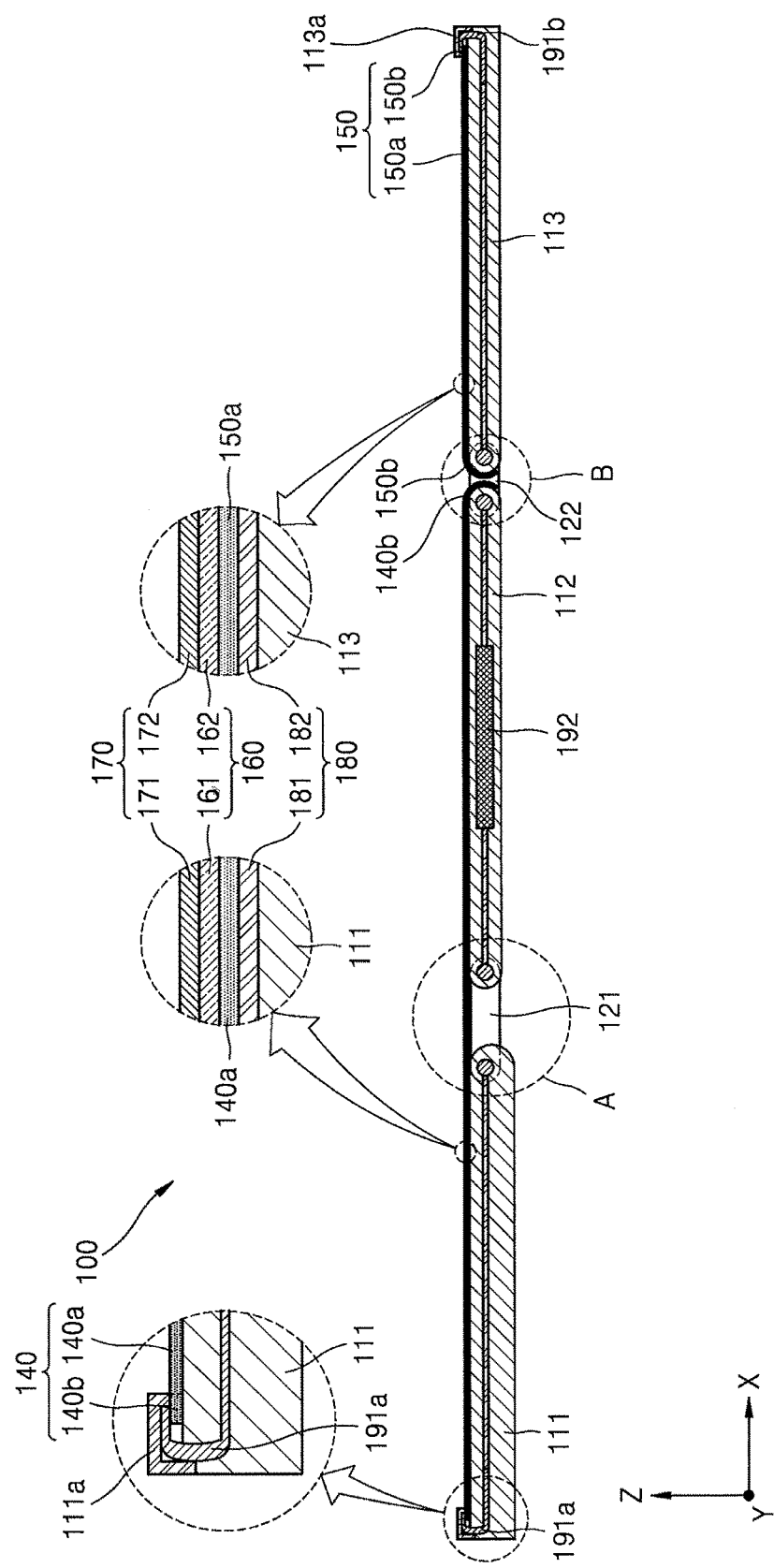
FIG. 2 illustrates a cross-sectional view taken along a line II-II' of FIG. 1.
Figure 3:
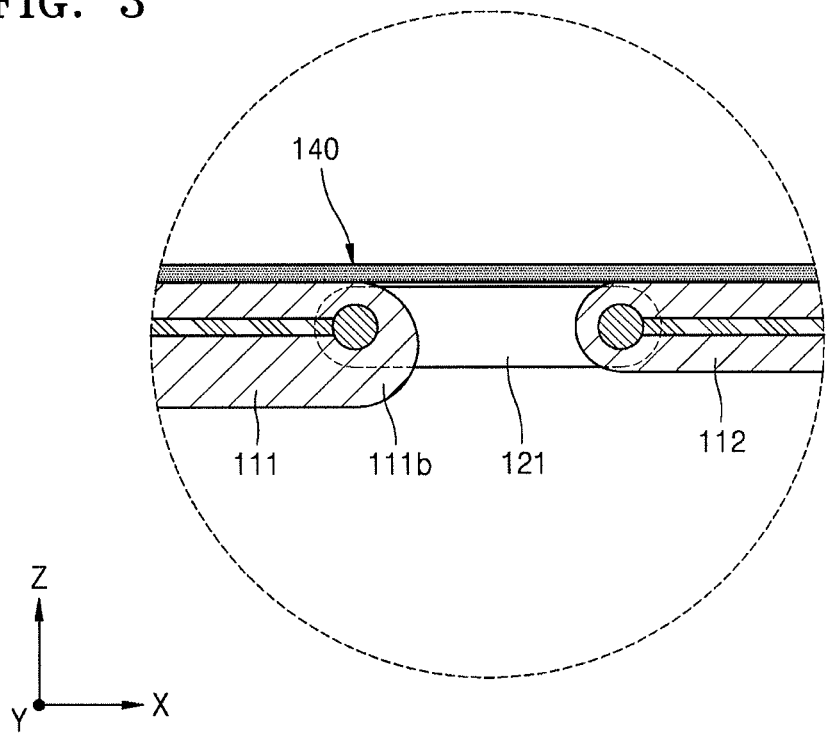
FIG. 3 illustrates an enlarged view of a portion A of FIG. 2.
Figure 4:
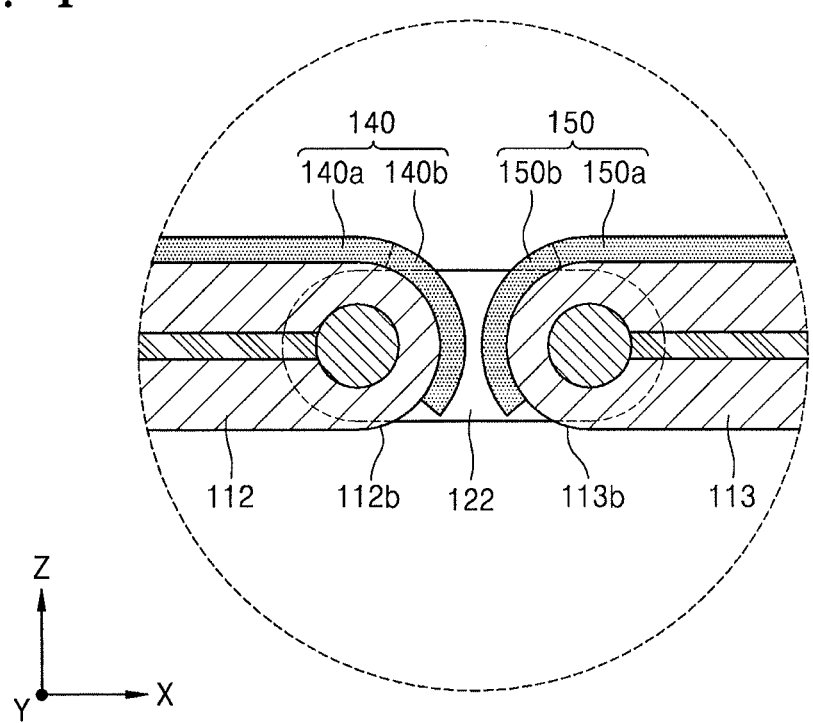
FIG. 4 illustrates an enlarged view of a portion B of FIG. 2.

FIG. 1 is a perspective view of a display device 100, according to an embodiment. FIG. 2 is a cross-sectional view taken along a line II-II' of FIG. 1. FIG. 3 is an enlarged view of a portion A of FIG. 2. FIG. 4 is an enlarged view of a portion B of FIG. 2.

Referring to FIGS. 1 through 4, the display device 100 may include a housing 110, a connector 120, a display panel 130, a polarization layer 160, a touch panel 170, a protection layer 180, flexible printed circuit boards 191a and 191b, and a controller 192.

The housing 110 may be foldable. In this regard, the housing 110 may include a first housing 111, a second housing 112, and a third housing 113 that are connected to each other.

At least one of the first housing 111, the second housing 112, and the third housing 113 may have space inside. In this regard, a circuit substrate, battery, etc. may be accommodated in at least one of the first housing 111, the second housing 112, and the third housing 113.

The first housing 111, the second housing 112, and the third housing 113 may be rotatably connected to each other. For example, the first housing 111 may be rotatably connected to the second housing 112. The second housing 112 may be rotatably connected to the third housing 113. In this regard, the connector 120 may be provided between the first housing 111 and the second housing 112, and between the second housing 112 and the third housing 113, to connect the first housing 111 and the second housing 112 each other, and to connect the second housing 112 and the third housing 113 each other.

At least one of an edge 111b of the first housing 111, an edge 112b of the second housing 112, and an edge 113b of the third housing 113 may have various shapes. For example, at least one of the edge 111b of the first housing 111, the edge 112b of the second housing 112, and the edge 113b of the third housing 113 may be bent. In another embodiment, at least one of the edge 111b of the first housing 111, the edge 112b of the second housing 112, and the edge 113b of the third housing 113 may be rounded. In another embodiment, at least one of the edge 111b of the first housing 111, the edge 112b of the second housing 112, and the edge 113b of the third housing 113 may have a polygonal cross-sectional shape. However, for convenience of description, a case where all the edge 111b of the first housing 111, the edge 112b of the second housing 112, and the edge 113b of the third housing 113 are rounded will be described in detail below.

The connector 120 may include a first connector 121 connecting the first housing 111 and the second housing 112, and a second connector 122 connecting the second housing 112 and the third housing 113.

The first connector 121 may be rotatably connected to each of the first housing 111 and the second housing 112. The second connector 122 may be rotatably connected to each of the second housing 112 and the third housing 113.

The first connector 121 and the second connector 122 may have various shapes. For example, the first connector 121 and the second connector 122 may have a link shape. In another embodiment, the first connector 121 and the second connector 122 may a hinge shape. For convenience of description, a case where the first connector 121 and the second connector 122 have the link shape will be described in detail below.

The display panel 130 may include a first display panel 140 and a second display panel 150. In this regard, the first display panel 140 and the second display panel 150 may be separated from each other.

The first display panel 140 and the second display panel 150 may be flexible. In this regard, the first display panel 140 and the second display panel 150 may be installed along an outer surface of the housing 110 and may have shapes varying according to whether the housing 110 is foldable. The first display panel 140 and the second display panel 150 may be the same. In this regard, the first display panel 140 and the second display panel 150 will be described in detail below.

The first display panel 140 may be disposed over the first housing 111 and the second housing 112. In this regard, the first display panel 140 may be fixed to the first housing 111 and the second housing 112 in various ways. For example, the first display panel 140 may be fixed to the first housing 111 and the second housing 112 via a first cover 111a and a second cover 112a that are respectively combined with the first housing 111 and the second housing 112. In another embodiment, the first display panel 140 may be attached to the first housing 111 and the second housing 112 by using an adhesive material without a separate structure. However, for convenience of description, a case where the first display panel 140 is fixed to the first housing 111 and the second housing 112 via the first cover 111a and the second cover 112a will be described in detail below.

The first display panel 140 may be simultaneously folded with the folding of the first housing 111 and the second housing 112. For example, the first display panel 140 may be folded between the first housing 111 and the second housing 112. In this case, a compressive force may be applied to a folded portion of the first display panel 140.

At least a part of the first display panel 140 may be installed in at least one of the edge 111b of the first housing 111 and the edge 112b of the second housing 112 so that the at least a part of the first display panel 140 is bent with respect to the at least one of the edge 111b of the first housing 111 and the edge 112b of the second housing 112. For example, as an embodiment, at least a part of the first display panel 140 may be installed in the edge 111b of the first housing 111 in a bent state. In another embodiment, at least a part of the first display panel 140 may be installed in the edge 112b of the second housing 112 in a bent state. In another embodiment, a part of the first display panel 140 may be installed in the edge 111b of the first housing 111 and the edge 112b of the second housing 112 in a bent state. In this regard, ends of the first display panel 140 that are opposite to each other may be installed in an end of the first housing 111 and an end of the second housing 112 in a bent state. For convenience of description, a case where at least a part of the first display panel 140 is installed in the edge 112b of the second housing 112 in the bent state will be described in detail below.

The first display panel 140 may include a first display portion 140a implementing an image, a video, or the like and a first non-display portion 140b surrounding an edge of the first display portion 140a. In this regard, the first display portion 140a may form a display area, and the first non-display portion 140b may form a non-display area that does not implement the image or the video.

The first display portion 140a may be disposed over the first housing 111 and the second housing 112. In this regard, the first display portion 140a may be simultaneously folded with the folding of the first housing 111 and the second housing 112.

The first non-display portion 140b may be disposed over the edges 111b of the first housing 111 and 112b of the second housing 112. In this regard, a part of the first non-display portion 140b may be disposed over at least a part of at least one of the edge 111b of the first housing 111 and the edge 112b of the second housing 112 in a bent state. For example, a bent portion of the first non-display portion 140b may be disposed over a rounded portion of the second housing 112 and have a rounded shape such that the bent portion corresponds to an outer surface of the second housing 112, thereby providing a tensile force to the first display panel 140. The first non-display portion 140b may surround ½ of an outer surface of the rounded part of the second housing 112.

A part of the first non-display portion 140b may be shielded by the first cover 111a and the second cover 112a.

The second display panel 150 may be disposed over the third housing 113 such that the second display panel 150 is spaced apart from the first display panel 140. In this regard, an edge of the first display panel 140 and an edge of the second display panel 150 may face each other. For example, the edge of the first display panel 140 may be bent along at least a part of the edge 112b of the second housing 112. The edge of the second display panel 150 may be bent along at least a part of the edge 113b of the third housing 113.

The second display panel 150 may be fixed to the third housing 113 in various ways. For example, the second display panel 150 may be seated in the third housing 113 and may be fixed by a third cover 113a that is combined with the third housing 113. The second display panel 150 may be fixed to the third housing 113 by a separate adhesive member disposed in the third housing 113. However, for convenience of description, a case where the second display panel 150 is fixed to the third housing 113 by the third cover 113a will be described in detail below.

The second display panel 150 may include a second display portion 150a and a second non-display portion 150b. In this regard, the second display portion 150a that is a display area may be disposed over the third housing 113, and the second non-display portion 150b that is a non-display area may be disposed in an edge of the third housing 113. For example, the second non-display portion 150b may be disposed over the edge 113b of the third housing 113 in a bent state.

At least one of the polarization layer 160 and the touch panel 170 may be disposed over at least one of the first display panel 140 and the second display panel 150. In this regard, the polarization layer 160 and the touch panel 170 may be flexibly formed.

When the polarization layer 160 and the touch panel 170 are disposed over at least one of the first display panel 140 and the second display panel 150, the polarization layer 160 and the touch panel 170 may be stacked. For convenience of description, a case where the polarization layer 160 and the touch panel 170 are sequentially disposed over at least one of the first display panel 140 and the second display panel 150 will be described in detail below.

The polarization layer 160 may be formed by coating a polarization material onto at least one of the first display panel 140 and the second display panel 150 or by attaching a layer or film of the polarization material to at least one of the first display panel 140 and the second display panel 150 via, for example, an adhesive member, after manufacturing the polarization material in film form. The touch panel 170 may be attached to at least one of the display panel 140, the second display panel 150, and the polarization layer 160 via, for example, an adhesive member, by forming a plurality of layers detecting whether to contact a user's body on one of the first display panel 140, the second display panel 150, and the polarization layer 160 or forming the plurality of layers as a film.

The polarization layer 160 may be disposed over at least one of the first display panel 140 and the second display panel 150. In this regard, the polarization layer 160 may include a first polarization layer 161 disposed over the first display panel 140 and a second polarization layer 162 disposed over the second display panel 150.

The touch panel 170 may be disposed over the polarization layer 160. In this regard, the touch panel 170 may include a first touch panel 171 disposed over the first polarization layer 161 and a second touch panel 172 disposed over the second polarization layer 162.

The protection layer 180 may be disposed over a rear surface of at least one of the first display panel 140 and the second display panel 150. In this regard, the protection layer 180 may be formed by coating a protection material to the rear surface of at least one of the first display panel 140 and the second display panel 150 or may be disposed over the rear surface of at least one of the first display panel 140 and the second display panel 150 as a film.

The protection layer 180 may include a first protection layer 181 disposed over a rear surface of the first display panel 140 and a second protection layer 182 disposed over a rear surface of the second display panel 150.

The first protection layer 181 may be disposed between the first display panel 140 and the first housing 111 and the first display panel 140 and the second housing 112. The second protection layer 182 may be disposed between the second display panel 150 and the third housing 113.

The flexible printed circuit boards 191a and 191b may connect the controller 192 and at least one of the first display panel 140 and the second display panel 150. In this regard, the flexible printed circuit boards 191a and 191b may include a first flexible printed circuit board 191a connecting the first display panel 140 and the controller 192 and a second flexible printed circuit board 191b connecting the second display panel 150 and the controller 192.

The first flexible printed circuit board 191a may be connected to an end of the first display panel 140. For example, the first flexible printed circuit board 191a may be connected to the end of the first display panel 140 that is not bent. In this regard, the first flexible printed circuit board 191a may be bent and may have one end connected to the end of the first display panel 140 and another end inserted into the first housing 111. For example, a terminal inputting a driving signal, etc. of the first display panel 140 may be disposed in the end of the first display panel 140 to which the first flexible printed circuit board 191a is connected.

The first flexible printed circuit board 191a may be partially exposed to the outside of the first housing 111. In another embodiment, the first flexible printed circuit board 191a may be completely inserted into the first housing 111.

In another embodiment, the first flexible printed circuit board 191a may be partially exposed to the outside of the first housing 111 and may be shielded by the first cover 111a. However, for convenience of description, a case where the first flexible printed circuit board 191a is exposed to the outside of the first housing 111 and shielded by the first cover 111a will be described in detail below.

The second flexible printed circuit board 191b may be connected to an end of the second display panel 150. For example, the second flexible printed circuit board 191b may be connected to the end of the second display panel 150 that is not bent. In this regard, the second flexible printed circuit board 191b may be bent and may have one end connected to the end of the second display panel 150 and another end inserted into the third housing 113. For example, a terminal inputting a driving signal, etc. of the second display panel 150 may be disposed in the end of the second display panel 150 to which the second flexible printed circuit board 191b is connected.

The second flexible printed circuit board 191b may be partially exposed to the outside of the third housing 113. In another embodiment, the second flexible printed circuit board 191b may be completely inserted into the third housing 113. In another embodiment, a part of the second flexible printed circuit board 191b exposed to the outside of the third housing 113 may be shielded by the third cover 113a. For convenience of description, a case where the second flexible printed circuit board 191b is shielded by the third cover 113a will be described in detail below.

The controller 192 may be connected to the first flexible printed circuit board 191a and the second flexible printed circuit board 191b. In this regard, two controllers 192 may be respectively connected to the first flexible printed circuit board 191a and the second flexible printed circuit board 191b. In another embodiment, the one controller 192 may be connected to both the first flexible printed circuit board 191a and the second flexible printed circuit board 191b. For convenience of description, a case where the one controller 192 is connected to both the first flexible printed circuit board 191a and the second flexible printed circuit board 191b will be described in detail below.

The controller 192 may be installed in one of the first housing 111, the second housing 112, and the third housing 113. For convenience of description, a case where the controller 192 is disposed in the second housing 112 will be described in detail below.

The controller 192 and the first flexible printed circuit board 191a and the second flexible printed circuit board 191b may be directly connected to each other. In another embodiment, the controller 192 may be connected to the first flexible printed circuit board 191a and the second flexible printed circuit board 191b via a separate structure such as a cable, etc. For convenience of description, a case where the controller 192 is connected to the first flexible printed circuit board 191a and the second flexible printed circuit board 191b via the separate structure such as a cable, etc. will be described in detail below.

A cable connecting the first flexible printed circuit board 191a and the controller 192 may be disposed in the first housing 111, the first connector 121, and the second housing 112. A cable connecting the second flexible printed circuit board 191b and the controller 192 may be disposed in the third housing 113, the second connector 122, and the second housing 112.

The controller 192 may implement an image or a video, etc. in the first display panel 140 and the second display panel 150 according to positions of the first housing 111, the second housing 112, and the third housing 113. In this regard, the controller 192 may control the first display panel 140 and the second display panel 150 to connect an image or a video in a part of the first display panel 140 and a part of the second display panel 150 in which the second connector 122 is disposed.

In addition to the above case, the display device 100 may further include a battery (not shown) electrically connected to the controller 191, the first display panel 140, and the second display panel 150, etc. In this regard, the battery may be installed in at least one of the first housing 111, the second housing 112, and the third housing 113. Connection between the battery and other devices may be the same as or similar to connection between the controller 192 and the first flexible printed circuit board 191a or the second flexible printed circuit board 191b, and thus a detailed description thereof is omitted.

The display device 100 may install the first display panel 140 and the second display panel 150 while the housing 110 and the connector 120 are combined with each other. In this regard, the first display panel 140 may be disposed over the first housing 111 and the second housing 112. A part of the edge of the first display panel 140 may be installed in at least a part of the edge 112b of the second housing 112 while the part of the edge of the first display panel 140 is bent to correspond to a rounded part of the edge 112b of the second housing 112. In this case, a tensile force may be applied to a rounded front surface of the first display panel 140, and a compressive force may be applied to a rear surface of the first display panel 140.

The second display panel 150 may be disposed in the third housing 113. In this regard, the edge of the second display panel 150 may be installed in at least a part of the edge 113b of the third housing 113. For example, in this case, a part of the edge of the second display panel 150 may surround at least a part of the edge 113b of the third housing 113. For example, the second display panel 150 may be installed to surround at least a part of a surface of the edge 113b of the third housing 113 facing the second housing 112.

In this case, the first non-display portion 140b and the second non-display portion 150b may face each other. In addition, the first display portion 140a and the second display portion 150a may meet at a boundary between the second housing 112 and the third housing 113, thereby implementing a still image or a moving image from connected images.

An operating state of the display device 100 will be described in detail below.

Figure 5:
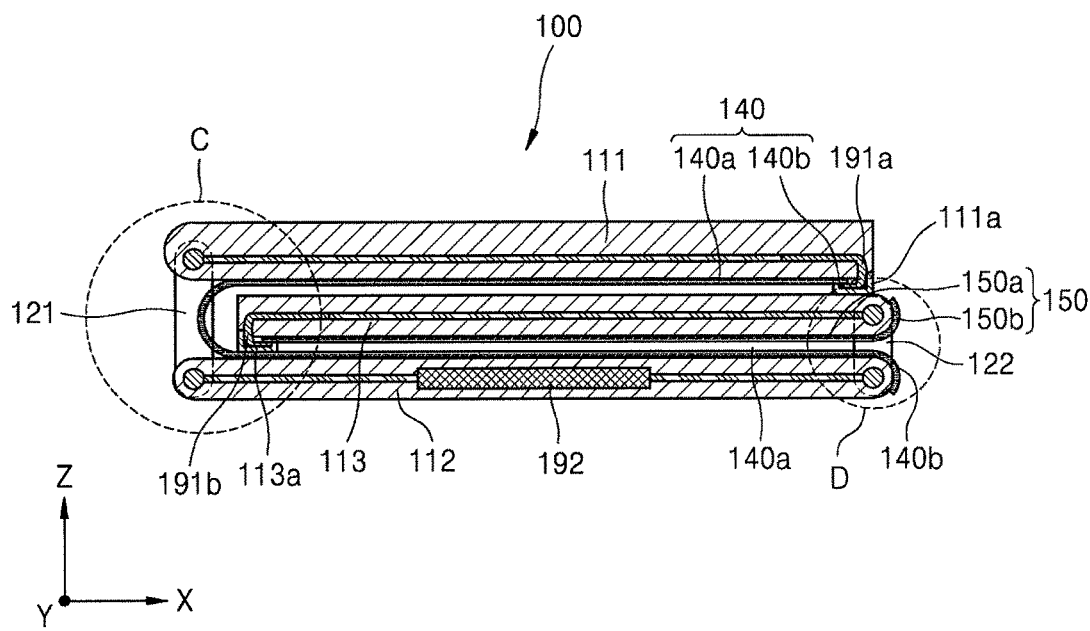
FIG. 5 illustrates a cross-sectional view of an operating state of the display device of FIG. 1.
Figure 6:
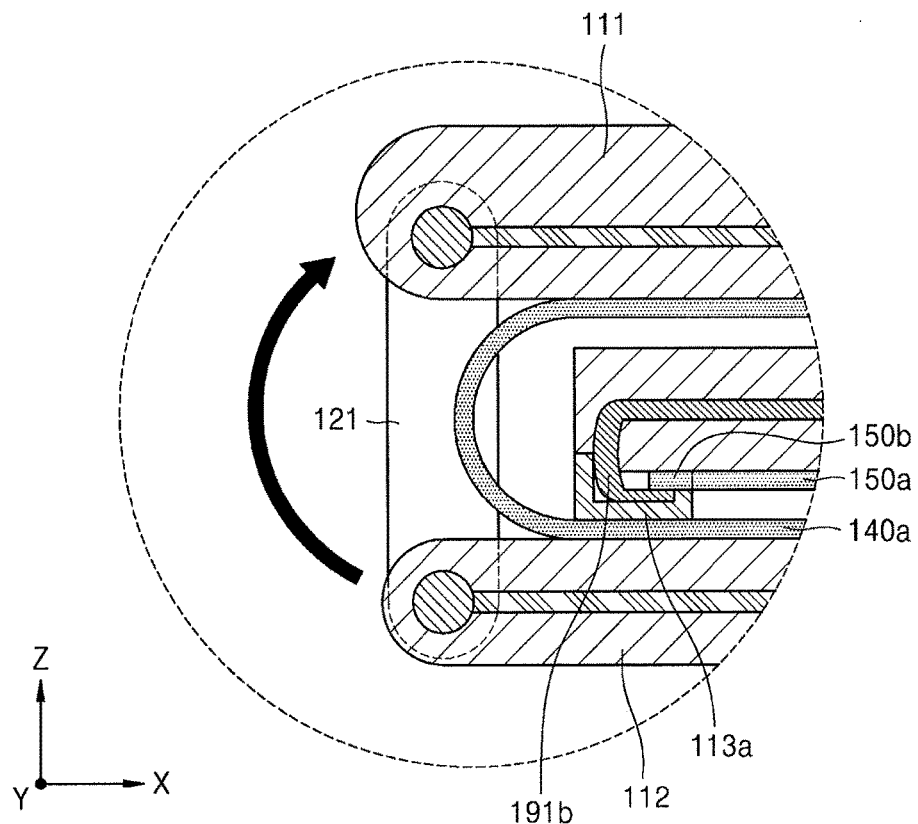
FIG. 6 illustrates an enlarged view of a portion C of FIG. 5.
Figure 7:
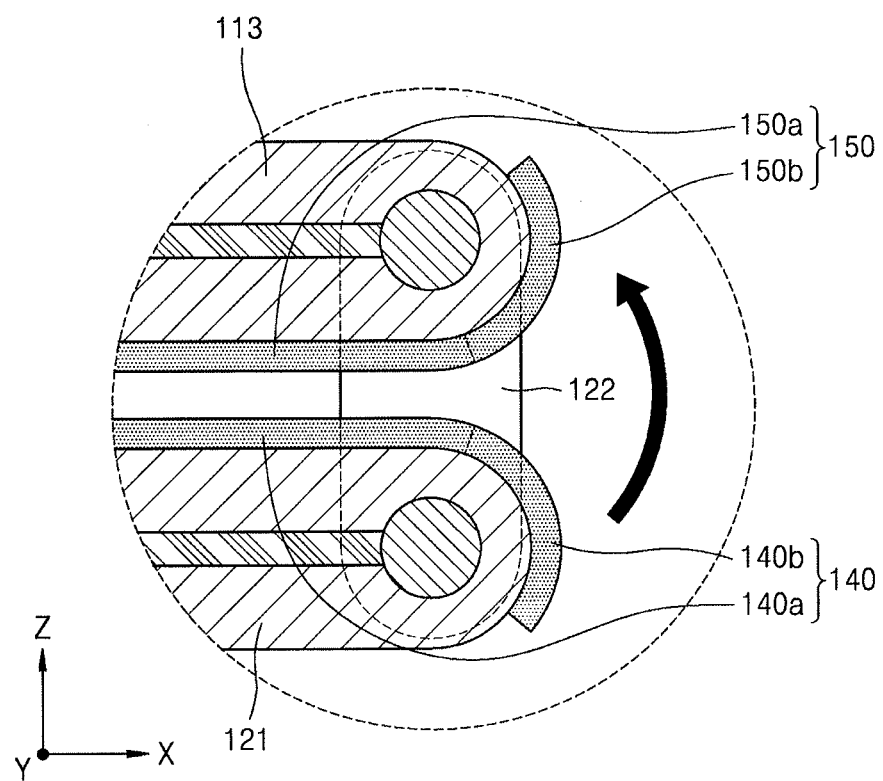
FIG. 7 illustrates an enlarged view of a portion D of FIG. 6.

FIG. 5 is a cross-sectional view of an operating state of the display device 100 of FIG. 1. FIG. 6 is an enlarged view of a portion C of FIG. 5. FIG. 7 is an enlarged view of a portion D of FIG. 6.

Referring to FIGS. 5 through 7, the display device 100 may be foldable, and may be placed in a folded state or unfolded state. For example, when the display device 100 is kept in a bag or a pocket, etc. the display device 100 may be in a folded state. When the display device 100 is used, the display device 100 may allow the first display panel 140 and the second display panel 150 to implement an image or video in an unfolded state. In this regard, the first display panel 140 and the second display panel 150 may be separately driven and may also simultaneously implement a plurality of images or videos.

In connection with a method of folding the display device 100 in the unfolded state, the third housing 113 and the first housing 111 may rotate in relation to the second housing 1112. In this regard, the first housing 111 and the third housing 113 may rotate in opposite directions. For example, when the first housing 111 rotates clockwise in relation to the second housing 112, the third housing 113 may rotate counterclockwise in relation to the second housing 112. When the first housing 111 rotates counterclockwise in relation to the second housing 112, the third housing 113 may rotate clockwise in relation to the second housing 112. However, for convenience of description, as shown in FIG. 5, a case where the first housing 111 rotates clockwise in relation to the second housing 112, and the third housing 113 rotates counterclockwise in relation to the second housing 112 will be described in detail below.

When the first housing 111 and the third housing 113 rotate, the third housing 113 may first rotate. In this regard, the third housing 113 may rotate counterclockwise in relation to the second housing 112. The second display panel 150, the second polarization layer 162, the second touch panel 172, and the second protection layer 182 may rotate according to a rotation of the third housing 113. In this case, the second touch panel 172 may face the first touch panel 171.

If the third housing 113 completely rotates, the first housing 111 may rotate clockwise in relation to the second housing 112. In this regard, the third housing 113 may be disposed between the first housing 111 and the second housing 112. The first display panel 140, the first polarization layer 161, the first touch panel 171, and the first protection layer 181 may rotate simultaneously with the first housing 111 so that the first display panel 140, the first polarization layer 161, the first touch panel 171, and the first protection layer 181 are folded in relation to between the first housing 111 and the second housing 112. In this case, the first touch panel 171 may face a rear surface of the third housing 113.

As described above, when the first display panel 140, the first polarization layer 161, the first touch panel 171, and the first protection layer 181 are folded, a compressive force may be applied to a front surface of the first display panel 140, and a tensile force may be applied to a rear surface of the first display panel 140. In this regard, an image, etc. may be implemented on the front surface of the first display panel 140, and the first protection layer 181 may be disposed on the rear surface of the first display panel 140. For example, the first protection layer 181 may contact the first housing 111 and the second housing 112.

The compressive force and the tensile force may tend to damage the first display panel 140 when the first housing 111 and the second housing 112 are repeatedly folded. For example, when the first display panel 140 is repeatedly folded, a brightness change may occur in the first display panel 140, and a defect may occur in an environment reliability evaluation.

In this regard, when a part of the edge of the first display panel 140 is disposed in at least a part of the edge 112b of the second housing 112 in a bent state as described above, a tensile force may be generated in a front surface of the bent part of the edge of the first display panel 140, and a compressive force may be generated in a rear surface of the bent part of the edge of the first display panel 140. Such tensile force and compressive force may offset the tensile force and the compressive force generated when the first display panel 140 is folded. Thus, the display device 100 may offset the tensile force and the compressive force generated when the first display panel 140 is repeatedly folded, thereby helping to minimize force applied to the first display panel 140. Thus, the display device 100 may reduce the possibility of destruction or damage due to the repeated folding of the first display panel 140, thereby helping to secure reliability of the display device 100 and an increased lifespan thereof.

The first display panel 140 and the second display panel 150 may be formed in the same or similar way. For convenience of description, the first display panel 140 will be described in detail below.

Figure 8:
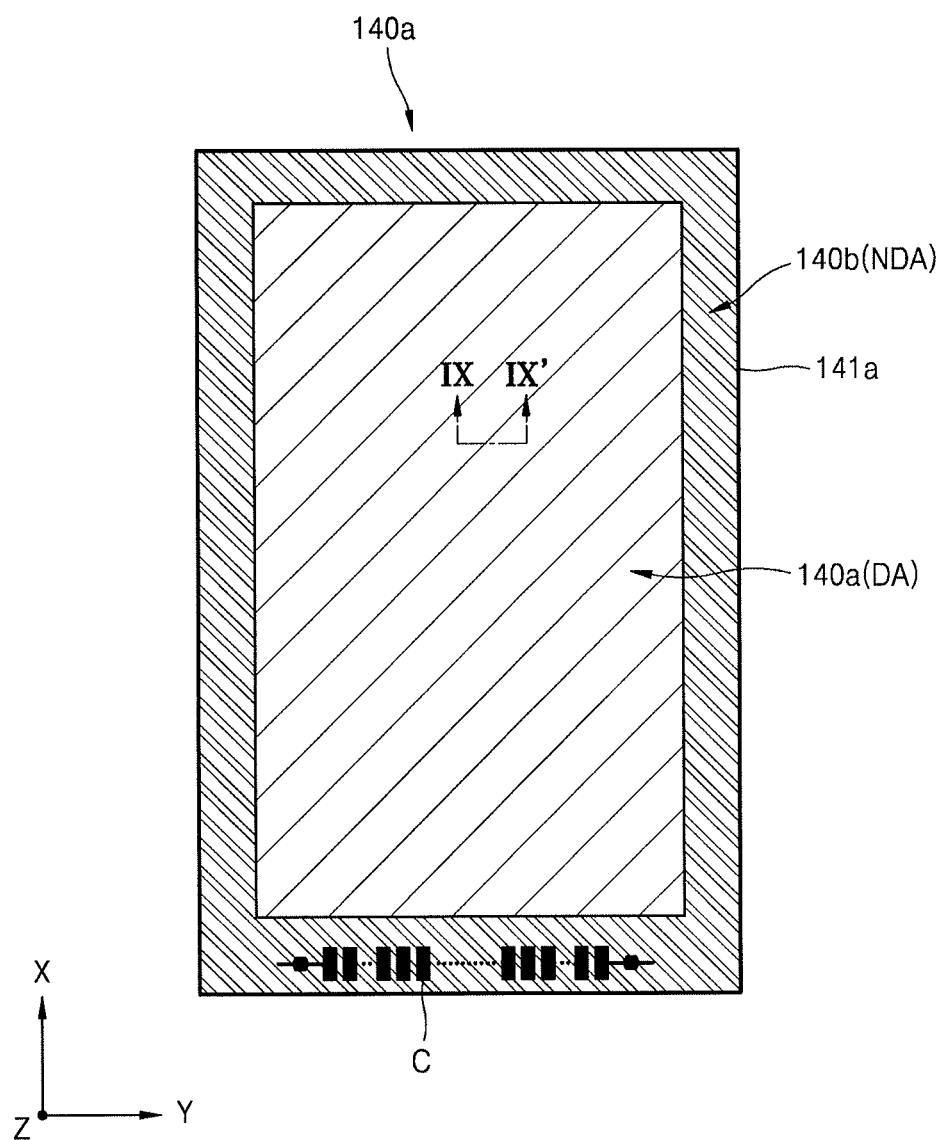
FIG. 8 illustrates a plan view of a first display panel of FIG. 1.
Figure 9:
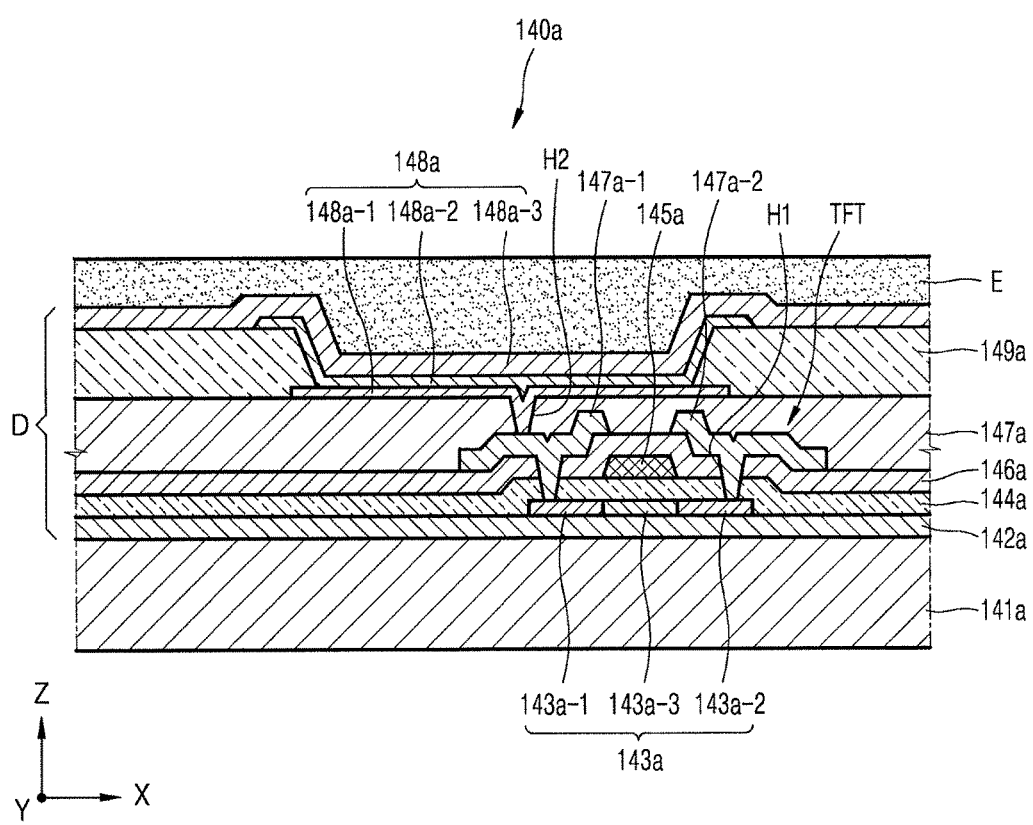
FIG. 9 illustrates a cross-sectional view taken along a line IX-IX' of FIG. 8.

FIG. 8 is a plan view of the first display panel 140 of FIG. 1. FIG. 9 is a cross-sectional view taken along a line IX-IX' of FIG. 8.

Referring to FIGS. 8 and 9, the first display panel 140 may include the first display portion 140a and the first non-display portion 140b. In this regard, the first display 140a may be defined as the display area DA on a substrate 141a, and the first non-display 141b may be defined as the non-display area NDA outside the display area DA. A display layer D may be disposed in the display area DA. A power wiring (not shown), etc. may be disposed in the non-display area NDA. A pad C may be disposed in the non-display area NDA. The first display portion 140a will be described in detail below.

The first display portion 140a may include the substrate 141a, the display layer D, and a thin film encapsulation layer E. Various layers may be stacked on the substrate 141a. In this regard, the substrate 141a may use a plastic material, or may use a metal material, such as, stainless steel (SUS) or titanium (Ti). The substrate 141a may use polyimide (PI). For convenience of description, a case where the substrate 141a includes PI will now be described in detail below.

The display layer D may be formed over the substrate 141a. In this regard, the display layer D may include a thin film transistor TFT, a passivation layer 147a covering the thin film transistor TFT and an organic light-emitting diode (OLED) 148a formed over the passivation layer 147a.

A buffer layer 142a including an organic compound and/or an inorganic compound may be further formed over an upper surface of the substrate 141a. The buffer layer 142a may include silicon oxide ($SiO_x$) ($x \geq 1$) or silicon nitride ($SiN_x$) ($x \geq 1$).

An active layer 143a arranged in a predetermined pattern may be formed over the buffer layer 142a and then buried by a gate insulating layer 144a. The active layer 143a may include a source area 143a-2 and a drain area 143a-1 and may further include a channel area 143a-3 therebetween.

The active layer 143a may be formed to include various materials. For example, the active layer 143a may include an inorganic semiconductor material such as amorphous silicon or crystalline silicon. As another example, the active layer 143a may include an oxide semiconductor. As another example, the active layer 143a may include an organic semiconductor material. However, for convenience of description, a case where the active layer 143a includes amorphous silicon will now be described in detail below.

The active layer 143a may be formed by forming an amorphous silicon layer on the buffer layer 142a, crystallizing the amorphous silicon layer to form a polycrystalline silicon layer, and patterning the polycrystalline silicon layer. The source area 143a-2 and the drain area 143a-1 may be doped with impurities according to a TFT type, such as a driving TFT (not shown), a switching TFT (not shown), or the like. The channel area 143a-3 may be formed between the source area 143a-2 and the drain area 143a-1.

A gate electrode 145a facing the active layer 143a and an interlayer insulating layer 146a which buries the gate electrode 145a may be formed on an upper surface of the gate insulating layer 144a.

Contact holes H1 may be formed in the interlayer insulating layer 146a and the gate insulating layer 144a, and then a source electrode 147a-2 and a drain electrode 147a-1 may be formed over the interlayer insulating layer 146a such that the source electrode 147a-2 and the drain electrode 147a-1 contact the source area 143a-2 and the drain area 143a-1, respectively.

The passivation layer 147a may be formed above the thin film transistor TFT formed above. A pixel electrode 148a-1 of the OLED 148a may be formed above the passivation layer 147a. The pixel electrode 148a-1 may contact the drain electrode 147a-1 of the thin-film transistor TFT through a via hole H2 formed in the passivation layer 147a. The passivation layer 147a may include an inorganic material and/or an organic material in a single layer structure or a multilayer structure. The passivation layer 147a may be formed as a planarization layer such that an upper surface thereof is flat regardless of the unevenness of a lower layer under the passivation layer 147a or may be formed to be uneven according to the unevenness of the lower layer. The passivation layer 147a may be formed as a transparent insulator in order to achieve a resonance effect.

After forming the pixel electrode 148a-1 on the passivation layer 147a, a pixel-defining layer 149a may include an organic material and/or an inorganic material to cover the pixel electrode 148a-1 and the passivation layer 147a. The pixel-defining layer 149a may have an aperture via which the pixel electrode 148a-1 is exposed.

An intermediate layer 148a-2 and an opposite electrode 148a-3 may be formed over at least the pixel electrode 148a-1.

The pixel electrode 148a-1 may function as an anode, and the opposite electrode 148a-3 may function as a cathode. Polarities of the pixel electrode 148a-1 and the opposite electrode 148a-3 may be switched.

The pixel electrode 148a-1 and the opposite electrode 148a-3 may be insulated from each other by the intermediate layer 148a-2, and may apply voltages of different polarities to the intermediate layer 148a-2 to allow an organic emission layer to emit light.

The intermediate layer 148a-2 may include the organic emission layer. As an alternative example, the intermediate layer 148a-2 includes the organic emission layer and may further include at least one of a hole injection layer (HIL), a hole transport layer (HTL), an electron transport layer (ETL), and an electron injection layer (EIL). The present embodiment is not limited thereto. The intermediate layer 148a-2 may further include various other functional layers (not shown) in addition to the organic emission layer.

One unit pixel may include a plurality of sub-pixels. The plurality of sub-pixels may emit light of various colors. For example, the plurality of sub-pixels may emit red light, green light, and blue light, or emit red light, green light, blue light, and white light.

The thin film encapsulation layer E may include a plurality of inorganic layers or include an inorganic layer and an organic layer.

The organic layer of the thin film encapsulation layer E may include a polymer and may be a single layer or a stack layer including one of polyethylene terephthalate (PET), PI, polycarbonate (PC), epoxy, polyethylene, and polyacrylate. The organic layer may include polyacrylate. For example, the organic layer may include polymerization of a monomer composition including a diacrylate-based monomer and a triacrylate-based monomer. The monomer composition may further include monoacrylate-based monomer. The monomer composition may further include a suitable photoinitiator such as trimethyl benzoyl diphenyl phosphine oxide (TPO), etc.

The inorganic layer of the thin film encapsulation layer E may be a single layer or a stack layer including metal oxide or metal nitride. For example, the inorganic layer may include one of $SiN_x$, $Al_2O_3$, $SiO_2$, and $TiO_2$.

An uppermost layer exposed to the outside of the thin film encapsulation layer E may be formed as an inorganic layer to prevent infiltration of moisture to the OLED 148a.

The thin film encapsulation layer E may include at least one sandwich structure in which at least one organic layer is interposed between at least two inorganic layers. As another example, the thin film encapsulation layer E may include at least one sandwich structure in which at least one inorganic layer is interposed between at least two organic layers. As another example, the thin film encapsulation layer E may include a sandwich structure in which at least one organic layer is interposed between at least two inorganic layers and a sandwich structure in which at least one inorganic layer is interposed between at least two organic layers.

The thin film encapsulation layer E may include a first inorganic layer, a first organic layer, and a second inorganic layer sequentially from an upper portion of the OLED 148a.

As another example, the thin film encapsulation layer E may include a first inorganic layer, a first organic layer, a second inorganic layer, a second organic layer, and a third inorganic layer sequentially from the upper portion of the OLED 148a.

As another example, the thin film encapsulation layer E may include a first inorganic layer, a first organic layer, a second inorganic layer, a second organic layer, a third inorganic layer, a third organic layer, and a fourth inorganic layer sequentially from the upper portion of the OLED 148a.

A halogenated metal layer including lithium fluoride (LiF) may be further disposed between the OLED 148a and the first inorganic layer. The halogenated metal layer may prevent the OLED 148a from being damaged when the first inorganic layer is formed by sputtering.

The first organic layer may have a smaller area than the second inorganic layer. The second organic layer may also have a smaller area than the third inorganic layer.

By way of summation and review, as components for driving the display panel have become miniaturized, occupancy of the display panel in the display device is gradually increasing. The display panel has been developed to have a structure that may be curved to have a predetermined angle from a flat state.

In a display device formed to fold several times through a general display panel, when the display panel is folded, a compressive force may be applied to the display panel. In this case, the display panel may be damaged due to the compressive force, which may cause a problem in reliability of the displays device.

As described above, according to the embodiments, when a compressive force is applied, a display panel may be partially bent while disposed over a housing, thereby providing a tensile force for offsetting the compressive force and helping to prevent the display panel from being damaged. According to the embodiments, non-display areas fixed to the housing of the display panel and adjacent one other may be curved, and the display panel may display a still image or a moving image via display areas of the display panel, without any gap or space between the display areas. According to the example embodiments, when folding a display panel of a display device, damage to the display panel may be reduced or prevented, thereby helping to secure reliability of the display device. One or more embodiments may provide a display device having enhanced reliability by offsetting a compressive force and a tensile force formed in another part of a display panel when the compressive force is applied to the display panel, thereby helping to prevent the display panel from being damaged due to the compressive force.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a first housing;
a second housing rotatably connected to the first housing;
a third housing rotatably connected to the second housing
a first display panel disposed over the first housing and the second housing, and
a second display panel separate from the first display panel and installed over the third housing, wherein:
an opaque edge of the first display panel is bent along at least a portion of an edge of the second housing, and
an opaque edge of the second display panel is bent along at least a portion of an edge of the third housing, the opaque edge of the second display panel facing the opaque edge of the first display panel when the second housing and the third housing are parallel to each other in an unfolded state.

2. The display device as claimed in claim 1, wherein the first display panel is folded when the first housing and the second housing are folded together.

3. The display device as claimed in claim 1, wherein the first display panel includes:
a first display portion disposed over the first housing and the second housing; and
a first non-display portion surrounding an edge of the first display portion, the first non-display portion including the opaque edge of the first display panel.

4. The display device as claimed in claim 3, wherein:
the first non-display portion is installed in the second housing, and
at least a portion of the first non-display portion is bent along at least a portion of the edge of the second housing.

5. The display device as claimed in claim 4, wherein the edge of the second housing is rounded.

6. The display device as claimed in claim 1, wherein the first display panel is flexible.

7. The display device as claimed in claim 1, wherein at least one of a first polarization layer and a first touch panel is disposed over the first display panel.

8. The display device as claimed in claim 1, further comprising a first protection layer disposed over a lower surface of the first display panel.

9. The display device as claimed in claim 1, wherein the third housing is rotatably connected to the second housing so as to be folded between the first housing and the second housing.

10. The display device as claimed in claim 1, wherein the second display panel includes:
a second display portion disposed over the third housing; and
a second non-display portion surrounding an edge of the second display portion, the second non-display portion including the opaque edge of the second display panel.

11. The display device as claimed in claim 10, wherein:
the second non-display portion is installed in the third housing, and
the second non-display portion is bent along at least a portion of the edge of the third housing.

12. A display device, comprising:
a first housing;
a second housing movably connected to the first housing;
a third housing movably connected to the second housing;
a first display panel installed over the first housing and the second housing, and
a second display panel separate from the first display panel and installed over the third housing, wherein:
an edge of the first display panel provides a tensile force to the first display panel,
an edge of the second display panel provides a tensile force to the second display panel, and
the edge of the first display panel faces the edge of the second display panel.

13. The display device as claimed in claim 12, wherein the edge of the first display panel providing the tensile force to the first display panel is an opaque non-display area, and the edge of the second display panel providing the tensile force to the second display panel is an opaque non-display area.

14. A display device, comprising:
a first housing;
a second housing rotatably connected to the first housing; and
a first display panel disposed over the first housing and the second housing,
wherein an edge of the first display panel is bent along at least a portion of at least one of an edge of the first housing and an edge of the second housing,
wherein at least one of the edge of the first housing and the edge of the second housing is round.

* * * * *